United States Patent [19]
Engbretson et al.

[11] Patent Number: 5,311,150
[45] Date of Patent: May 10, 1994

[54] CONVERTIBLE OSCILLATOR CIRCUIT

[75] Inventors: Michael R. Engbretson; Garry N. Link, both of Aloha, Oreg.

[73] Assignee: Tektronix, Inc., Wilsonville, Oreg.

[21] Appl. No.: 947,200

[22] Filed: Sep. 18, 1992

[51] Int. Cl.⁵ .................. H03K 3/26; H03B 5/24
[52] U.S. Cl. ...................... 331/59; 331/111;
331/143; 331/153; 307/272.3; 307/276
[58] Field of Search ............ 331/59, 111, 113 R, 331/143, 144, 145, 153; 307/272.1, 272.3, 273, 276

[56] References Cited

U.S. PATENT DOCUMENTS 3,500,229  3/1970  Haggan ................. 331/59

FOREIGN PATENT DOCUMENTS 0145923  7/1986  Japan ................. 307/276

OTHER PUBLICATIONS

"Linear Databook", National Semiconductor Corporation, pp. 9-33 to 9-38.
Abandoned, unpublished, in-house invention of David McNeill dated Oct. 25, 1985.

Primary Examiner—David Mis
Attorney, Agent, or Firm—Boulden G. Griffith

[57] ABSTRACT

An integrated oscillator includes an amplifier having first and second voltage inputs, and first and second current outputs, and a current mirror having an input coupled to the second current output of the amplifier and an output coupled to the first current output of the amplifier. The output of the current mirror and the first current output of the amplifier are coupled through a bonding pad to an external capacitor. A first comparator has a first input coupled to the first current output of the amplifier and a second input for receiving a first threshold voltage, and a second comparator has a first input coupled to the first current output of the amplifier and a second input for receiving a second threshold voltage. A flip-flop has a first input coupled to the output of the first comparator, a second input, and an output coupled to the second voltage input of the amplifier. A first multiplexer has a first input for receiving a reference voltage, a second input coupled to the output of the second comparator, and an output coupled to the first voltage input of the amplifier. A second multiplexer has a first input coupled to the output of the second comparator, a second input for receiving an enable signal, and an output coupled to the second input of the flip-flop. The output of the second comparator forms a one-shot output node responsive to the enable signal, and the output of the flip-flop forms a free-running oscillator output node.

23 Claims, 4 Drawing Sheets

CONVERTIBLE OSCILLATOR CIRCUIT

BACKGROUND OF THE INVENTION

This invention relates generally to oscillator circuits and more particularly to integrated oscillator circuits for use with an external capacitor.

Integrated oscillator or timer circuits that operate in conjunction with an external capacitor that is alternatively charged and discharged are well known in the art. One such circuit, for example, is the LM555 Timer circuit manufactured by National Semiconductor Corporation of Santa Clara, Calif., and described at pages 9-33 through 9-38 of the 1982 Linear Databook. The LM555 timer circuit provides both "one-shot" and free-running oscillator operational modes. The circuit used in the LM555 circuit uses a saturated bipolar transistor to discharge the external capacitor. The use of a saturated transistor is suitable for use in a stand-alone integrated circuit such as the LM555, but is unacceptable if the timer circuit is used as only one functional block out of many on the integrated circuit. The reason for this is that injected substrate current from the saturated transistor can de-bias and otherwise adversely affect the operation of the other functional blocks on the integrated circuit. In addition, the stored charge in the saturated device reduces the maximum operating frequency. An additional limitation of this device is that the timing ramp on the external capacitor is an exponential R-C charge/discharge waveform instead of a linear triangle waveform, unless an external current source is used.

Other circuits for achieving a linear charge/discharge waveform at the capacitor do so with a first constant charging current, and a second switched discharging current that is twice the magnitude of the charging current. These circuits are generally undesirable because of the associated high power consumption.

What is desired is an oscillator circuit having both one-shot and free-running operational modes, a linear charge/discharge capacitor waveform, and minimum power consumption requirements.

SUMMARY OF THE INVENTION

It is, therefore, an object of the invention to provide a novel oscillator circuit configuration having constant and equal capacitor charging and discharging currents.

It is another object of the invention that the charge current is redirected within the oscillator to provide the discharge current, thus reducing power supply consumption requirements.

It is another object of the invention to provide an oscillator circuit having both one-shot and free-running operational modes.

It is an advantage of the invention that, except for the external capacitor, the oscillator circuit can be easily fabricated on an integrated circuit using minimum die area.

It is another advantage of the present invention that no external components are needed to create the linear timing ramp, except for the capacitor.

According to the present invention, an integrated oscillator circuit linearly charges and discharges an external capacitor once in a one-shot operational mode, and continually charges and discharges the capacitor in a free-running operational mode. The charging current is redirected within the oscillator circuit to provide the discharging current, thus reducing power supply consumption requirements. The integrated portion of the oscillator circuit includes a differential amplifier having first and second voltage inputs and first and second current outputs, the first current output of the amplifier being coupled to the external capacitor through a bonding pad. A precision current mirror has an input coupled to the second current output of the amplifier and an output coupled to the first current output of the amplifier. A first comparator has a first input coupled to the first current output of the amplifier and a second input for receiving a first threshold voltage, and a second comparator has a first input coupled to the first current output of the amplifier and a second input for receiving a second threshold voltage. An R-S flip-flop has a reset input coupled to the output of the first comparator, a set input, and an output coupled to the second voltage input of the amplifier. A first multiplexer has a first input for receiving a reference voltage, a second input coupled to the output of the second comparator, and an output coupled to the first voltage input of the amplifier. A second multiplexer has a first input coupled to the output of the second comparator, a second input for receiving an enable signal, and an output coupled to the second input of the flip-flop. The output of the second comparator forms a one-shot output node responsive to the enable signal, and the output of the flip-flop forms a free-running oscillator output node. The modes of the multiplexers are determined by a single select signal.

If only a single output node is desired, a third multiplexer can be included having a first input coupled to the free-running oscillator output node, a second input coupled to the one-shot output node, and an output for providing either a one-shot signal or a free-running oscillating signal. If only one of the operational modes is desired, dedicated one-shot and free-running versions of the oscillator of the present invention are provided and the multiplexers can be eliminated entirely.

The foregoing and other objects, features and advantages of the invention will become more readily apparent from the following detailed description of a preferred embodiment of the invention which proceeds with reference to the accompanying drawings.

DETAILED DESCRIPTION

Figure 1:
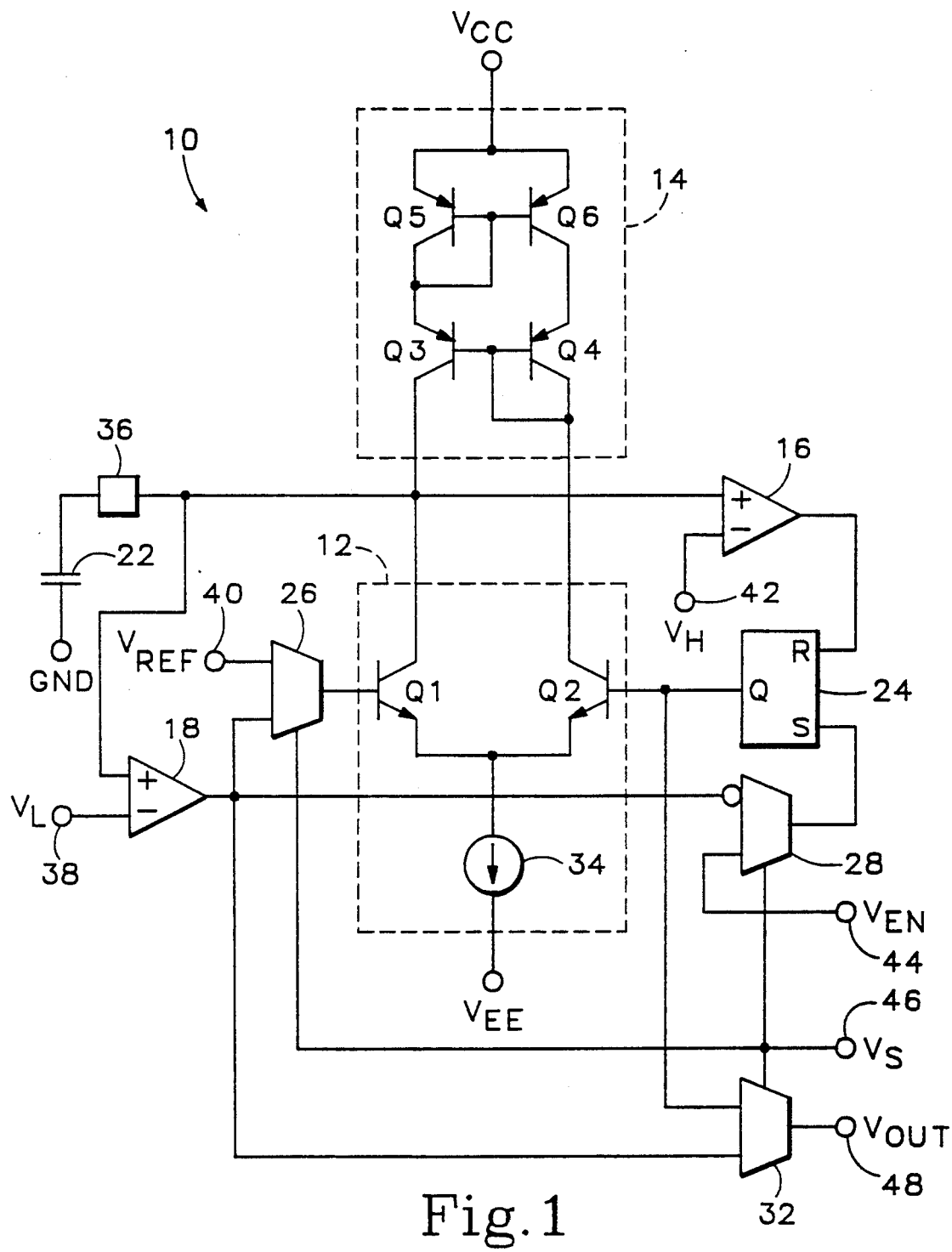
FIGS. 1-3 are schematic diagrams of three embodiments of the oscillator circuit of the present invention.

Referring now to the circuit diagram of FIG. 1, an integrated oscillator circuit 10 includes an amplifier 12, a current mirror 14, first and second comparators 16 and 18, an R-S flip-flop 24, and first, second, and third multiplexers 26, 28, and 32. These circuit components form a means for linearly charging and discharging an external capacitor 22. External capacitor 22 is coupled to the current output node of the circuit through an external integrated circuit bonding pad 36. The oscillator circuit 10 has two operational modes. In a first, one-shot operational mode, external capacitor 22 is charged and discharged once to produce a single output pulse having a predetermined pulse width. In a second, free-running operational mode, external capacitor 22 is charged and discharged continually to provide an oscillating signal output having a predetermined frequency of oscillation. The configuration of oscillator circuit 10 allows the charging current to be redirected to provide the discharging current, thus reducing power supply consumption requirements.

Amplifier 12 is a differential pair of bipolar transistors, emitter-coupled transistors Q1 and Q2. Bias current is provided by current source 34. Amplifier 12 has first and second voltage inputs at the bases of transistors Q1 and Q2 and first and second current outputs at the collectors of transistors Q1 and Q2. The capacitor discharge current flows into the collector of transistor Q1. Although a differential pair of transistors is shown in FIG. 1, other amplifiers having a differential voltage input and a differential current output can be used. A "super-Wilson" PNP current mirror 14 has an input coupled to the second current output of amplifier 12 (collector of transistor Q2) and an output coupled to the first current output of amplifier 12 (collector of transistor Q1). The super-Wilson PNP current mirror 14 is chosen for high accuracy, but other current mirrors can also be used. The output of current mirror 14 provides the charging current to external capacitor 22.

A first comparator 16 has a positive input coupled to the first current output of amplifier 12 and a negative input for receiving a high threshold voltage designated "$V_H$" at circuit node 42. A second comparator 18 has a positive input coupled to the first current output of amplifier 12 and a negative input for receiving a low threshold voltage designated "$V_L$" at circuit node 38. An R-S flip-flop 24 has a reset ("R") input coupled to the output of the first comparator 16, a set ("S") input coupled to the output of the second comparator 18, and an output coupled to the second voltage input of amplifier 12.

A first multiplexer 26 has a first input for receiving a reference voltage $V_{REF}$. The value of $V_{REF}$ is set substantially equal to the midpoint of the high and low values of the output of flip-flop 24. A second input of multiplexer 26 is coupled to the output of the second comparator 18, and the output is coupled to the first voltage input of amplifier 12. Multiplexer 26 is designed to have an output high level of $V_{REF}$ when oscillator circuit 10 is in the one-shot mode. A second multiplexer 28 has a first input coupled to the output of the second comparator 18, a second input for receiving an enable signal designated "$V_{EN}$", and an output coupled to the S input of flip-flop 24. In oscillator circuit 10, the output of the second comparator 18 forms a one-shot output node for providing a one-shot signal in response to the enable signal, and the output of the flip-flop forms a free-running oscillator output node for providing a continuously oscillating output signal.

If desired, oscillator circuit 10 can include a third multiplexer 32 for multiplexing between the one-shot and free-running outputs. Additional multiplexer 32 thus has a first input coupled to the free-running oscillator output node, a second input coupled to the one-shot output node. The selection between operational modes is made with the select logic signal, designated "VS", which is coupled to each of the first, second, and third multiplexers 26, 28, and 30.

The operation of the oscillator circuit is described in further detail below, with reference to equivalent circuits 20 and 30 shown in schematic diagram form in FIGS. 2 and 3, respectively. While each circuit 20 or 30 is an "equivalent circuit" representing either the one-shot or free-running operational mode, the equivalent circuit is an operational equivalent that can be used as shown in the schematic diagram if only that particular operational mode is desired. Therefore, each multiplexer 26, 28, and 30 is replaced in part by a short circuit representing the connection between the selected input and the output. The remaining unselected input is represented by an open circuit, and the input voltage is omitted. For example, in circuit 20 $V_{REF}$ does not appear, and in circuit 30 $V_{EN}$ does not appear, since these voltages are not needed in the operation of the equivalent circuit.

Figure 2:
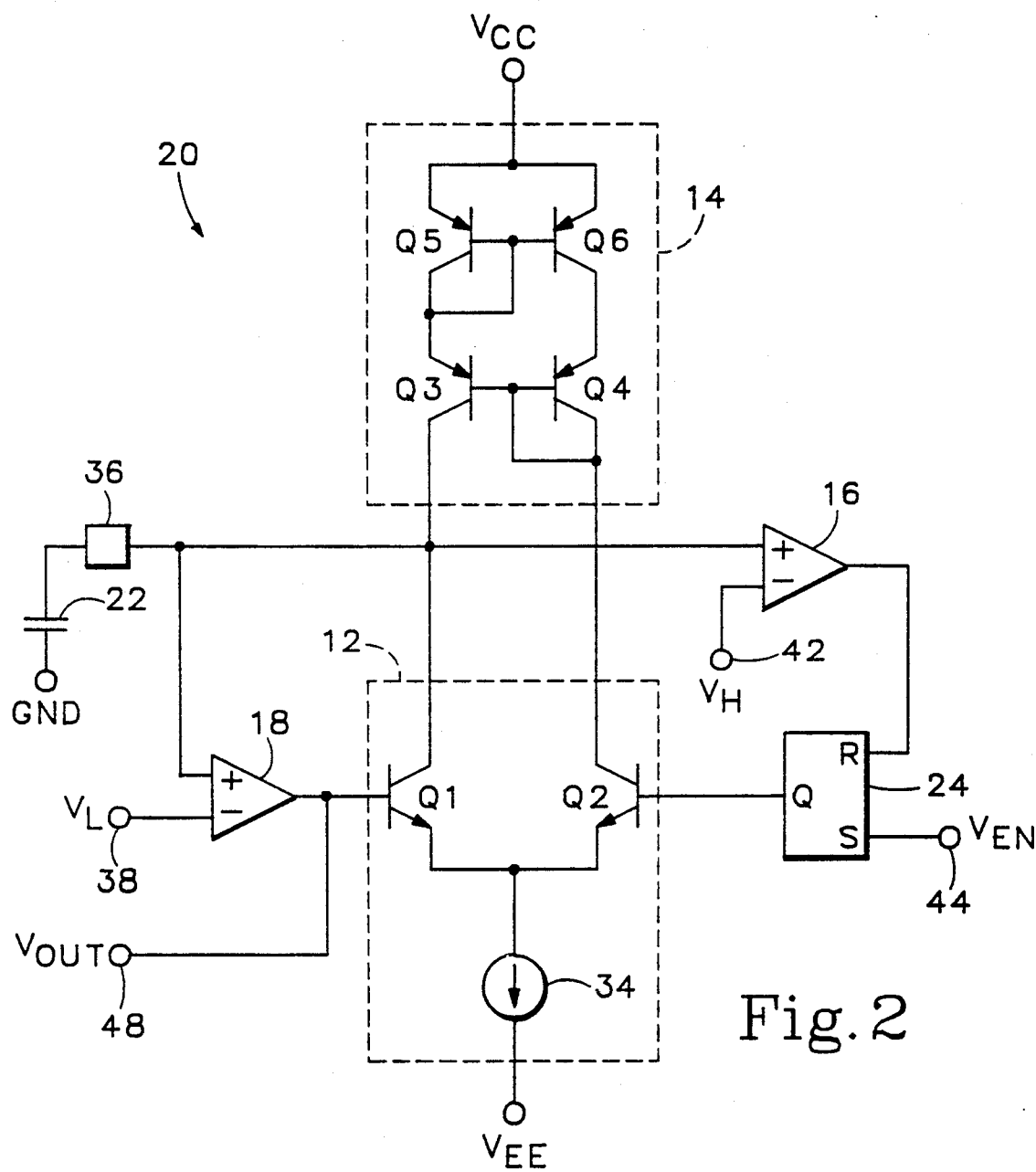

Referring now to FIG. 2, circuit 20 is the one-shot equivalent circuit of oscillator circuit 10. In circuit 20, all multiplexers are eliminated. The output of the second comparator 18 is thus coupled directly to the first voltage input of amplifier 12, and forms the one-shot output node at circuit node 48. No other connections are made to the output of the second comparator 18. The S input of flip-flop 24 directly receives the enable signal $V_{EN}$ at circuit node 44, which is a positive-going voltage pulse. The remaining circuit components and connections including the amplifier 12, current mirror 14, first and second comparators 16 and 18, flip-flop 24, and external capacitor 22 are the same as in oscillator circuit 10.

Figure 2A:
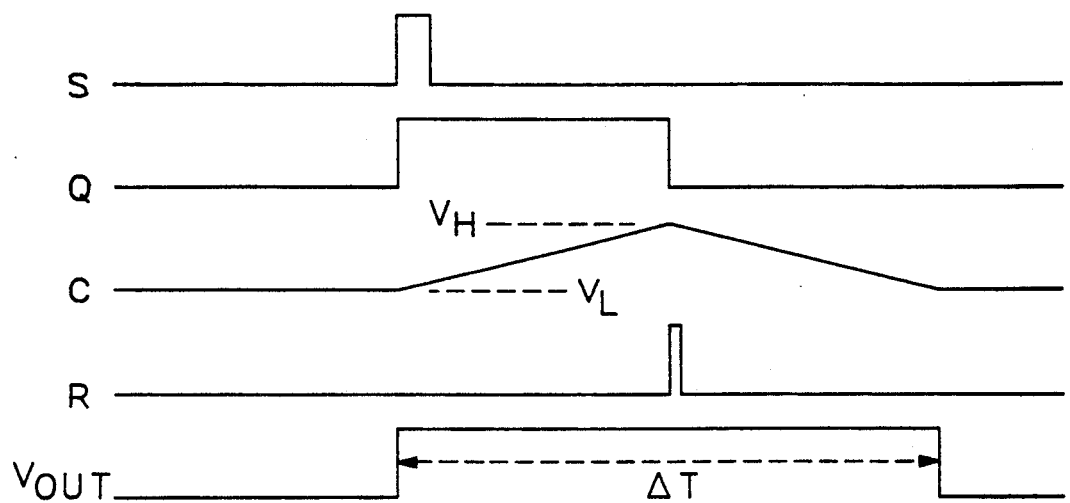
FIGS. 2A and 3A are timing diagrams corresponding respectively to the circuit embodiments shown in FIGS. 2 and 3.

Referring now to FIG. 2A, a timing diagram of the one-shot mode shows the waveforms for the following signals: the enable signal $V_{EN}$, the Q output of R-S flip-flop 24, the voltage on capacitor 22, the R input of R-S flip-flop 24 (output of the first comparator 16), and the output $V_{OUT}$ at circuit node 48. The signals are respectively labeled S, Q, C, R, and $V_{OUT}$. In the inactive state, the output of flip-flop 24 is low. The negative feedback loop that includes comparator 18, current mirror 14, and amplifier 12 insures that the capacitor voltage remains substantially at $V_L$ during the inactive state. The current flowing through transistors Q1 and Q2 is approximately equal. When a single-shot output pulse is desired, a positive-going enable signal pulse is provided to the S input of R-S flip-flop 24. The enable signal pulse forces the Q output of flip-flop 24 to a high level and capacitor 22 is charged by the current flowing from transistor Q2 and through current mirror 14. After capacitor 22 charges to the high threshold voltage level of $V_H$, the output of comparator 16 changes to a high level and resets flip-flop 24. In turn, the base of transistor Q2 is forced low, and current begins to flow into the collector of transistor Q1, discharging capacitor 22. Capacitor 22 continues to discharge until comparator 18 once again stabilizes the loop and the output of comparator 18 returns to the original low value. The pulsewidth of the output pulse at circuit node 48 is equal to $2C(V_H-V_L)/I$, wherein C is the value of the capacitor, $V_H$ is the value of the high threshold voltage, $V_L$ is the value of the low threshold voltage, and I is the total output current of amplifier 12 (substantially equal to current flowing in current source 34 except for alpha losses). The pulsewidth of the output pulse thus represents one charge and discharge cycle of capacitor 22.

Figure 3A:
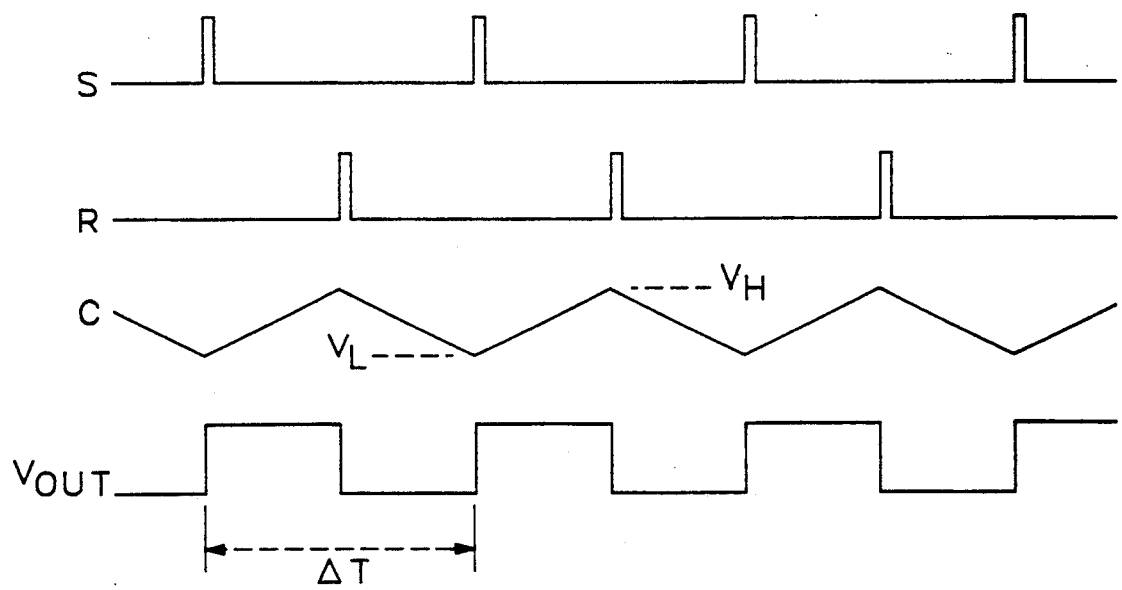
Figure 3:
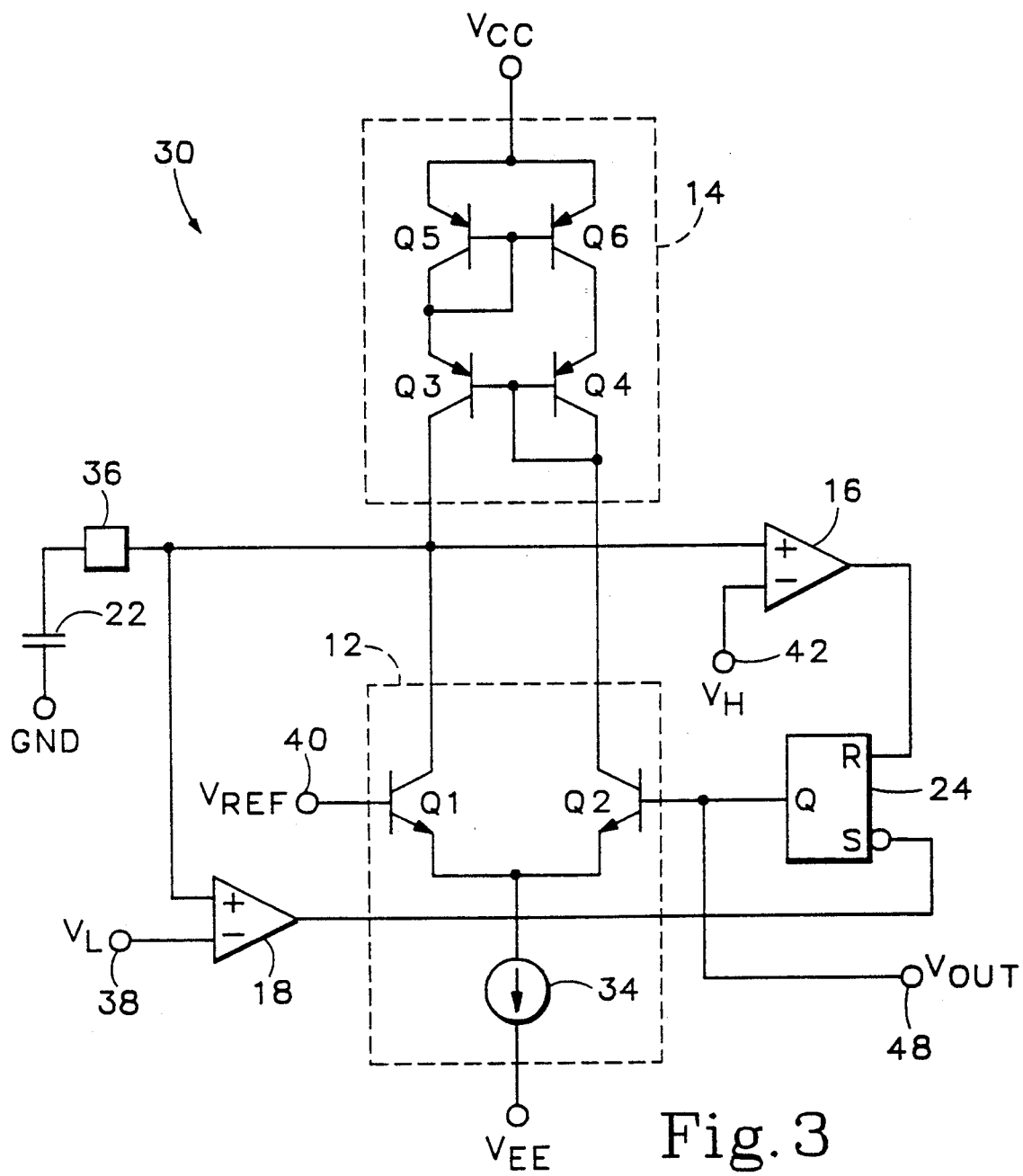

Referring now to FIG. 3, circuit 30 is the free-running oscillator equivalent circuit of oscillator circuit 10. In circuit 30, all multiplexers are again eliminated. The first voltage input of amplifier directly receiving the reference voltage $V_{REF}$ and is not coupled to any other circuit component. The S input of flip-flop 24 is directly coupled to the output of comparator 18 and is not coupled to any other circuit component. The free-running output of oscillator circuit 30 is taken at the Q output of flip-flop 24 at circuit node 48. The remaining circuit components and connections including the amplifier 12, current mirror 14, first and second comparators 16 and 18, flip-flop 24, and external capacitor 22 are the same as in oscillator circuit 10.

Referring now to FIG. 3A, a timing diagram of the free-running oscillator mode shows the waveforms for the following signals: output of comparator 18 (S input of flip-flop 24), output of comparator 16 (R input of flip-flop 24), voltage on capacitor 22, and oscillator output 48 (Q output of flip-flop 24). The signals are respectively labeled S, R, C, and $V_{OUT}$. In the free-running or "bistable" mode, capacitor 22 is continuously charged and discharged. To begin the following analysis assume that the capacitor voltage is midway between the $V_L$ and $V_H$ threshold voltages and that the output of flip-flop 24 is high. The base of transistor Q2 is more positive than the base of transistor Q1, and therefore current flows through transistor Q2 and the current mirror 14, thus charging capacitor 22. Once the capacitor voltage reaches the high threshold voltage VH, the output of comparator 16 goes high and resets the R-S flip-flop 24, forcing the Q output to go low. Once this occurs, the current in amplifier 12 switches and flows though transistor Q1 and begins to discharge capacitor 22. Once the voltage on capacitor 22 reaches the low threshold voltage VL, the output of comparator 18 goes low, is inverted and sets flip-flop 24. The Q output of the flip-flop 24 goes high, which causes current to flow through transistor Q2 and current mirror 14 and the charge/discharge cycle continues. The oscillating output signal squarewave has a period equal to $2C(V_H-V_L)/I$, wherein C is the value of capacitor 22, $V_H$ is the value of the first threshold voltage, $V_L$ is the value of the second threshold voltage, and I is the total output current of the amplifier.

While circuits 10, 20, and 30 are shown with comparators having single-ended outputs, and the R-S flip-flop 24 is shown having single-ended inputs and outputs, it is apparent to those skilled in the art that differential outputs and inputs can be used. In circuit 20, the positive output of comparator 18 is used to drive the base of transistor Q1 and the positive Q output of flip-flop 24 is used to drive the base of transistor Q2. The differential output of comparator 16 drives the differential R input of flip-flop 24. In oscillator circuit 30, the differential output of comparator 18 drives the differential S input of flip-flop 24, the differential output of comparator 16 drives the differential R input of flip-flop 24, and the differential Q output of flip-flop 24 drives the bases of transistors Q1 and Q2 (the existing differential input of amplifier 12). Note that in the all-differential embodiment, a separate reference voltage $V_{REF}$ is not required since the amplifier is driven differentially.

Having described and illustrated the principles of the invention in a preferred embodiment thereof, it is appreciated by those having skill in the art that the invention can be modified in arrangement and detail without departing from such principles. For example, although the schematic diagrams show a bipolar transistor-based circuit, it is known by those skilled in the art that an equivalent FET-based circuit can be built. We therefore claim all modifications and variation coming within the spirit and scope of the following claims.

We claim:

1. A circuit (10) comprising.
   a capacitor (22); and
   current means (12, 14, 16, 18, 24, 26, 28) having a current output node coupled to the capacitor for linearly charging and discharging the capacitor once in a first operational mode, and for continually charging and discharging the capacitor in a second operational mode,
   wherein the charging current is redirected within the current means to provide the discharging current.

2. The circuit (10) of claim 1 in which the current means is fabricated on a single integrated circuit, and the capacitor comprises an external capacitor that is coupled to the current output node of the current means through an external integrated circuit bonding pad (36).

3. The circuit (10) of claim 1 in which the current means comprises:
   an amplifier (12) having first and second voltage inputs and first and second current outputs, the first current output being coupled to the current output node of the current means;
   a current mirror (14) having an input coupled to the second current output of the amplifier and an output coupled to the first current output of the amplifier;
   a first comparator (16) having a first input coupled to the first current output of the amplifier, a second input for receiving a first threshold voltage, and an output;
   a second comparator (18) having a first input coupled to the first current output of the amplifier, a second input for receiving a second threshold voltage, and an output;
   a flip-flop (24) having a first input coupled to the output of the first comparator, a second input, and an output coupled to the second voltage input of the amplifier;
   a first multiplexer (26) having a first input for receiving a reference voltage, a second input coupled to the output of the second comparator, and an output coupled to the first voltage input of the amplifier; and
   a second multiplexer (28) having a first input coupled to the output of the second comparator, a second input for receiving an enable signal, and an output coupled to the second input of the flip-flop,
   wherein the output of the second comparator forms a one-shot output node, and the output of the flip-flop forms an oscillator output node.

4. The circuit (10) of claim 3 further comprising a third multiplexer (32) having a first input coupled to the oscillator output node, a second input coupled to the one-shot output node, and an output for providing a one-shot signal in the first operational mode and for providing an oscillating signal in the second operational mode.

5. A circuit (20) comprising:
   an amplifier (12) having first and second voltage inputs and first and second current outputs;
   a current mirror (14) having an input coupled to the second current output of the amplifier and an output coupled to the first current output of the amplifier;
   a first comparator (16) having a first input coupled to the first current output of the amplifier, a second input for receiving a first threshold voltage, and an output;
   a second comparator (18) having a first input coupled to the first current output of the amplifier, a second input for receiving a second threshold voltage, and an output coupled to the first voltage input of the amplifier for providing an output signal;

a capacitor (22) coupled between the first current output of the amplifier and ground; and a flip-flop (24) having a first input coupled to the output of the first comparator, a second input for receiving an enable signal, and an output coupled to the second voltage input of the amplifier.

6. The circuit of claim 5 in which the amplifier comprises:

a differential pair of transistors (Q1, Q2) having a pair of bases forming the first and second voltage inputs, a pair of collectors forming the first and second current outputs, and an emitter node; and a current source (34) coupled to the emitter node.

7. The circuit of claim 6 in which each of the transistors in the differential pair of transistors comprises an NPN bipolar transistor.

8. The circuit of claim 5 in which the current mirror comprises four transistors configured in a super-Wilson current mirror configuration.

9. The circuit of claim 8 in which each of the transistors in the super-Wilson current mirror comprises a PNP bipolar transistor.

10. The circuit of claim 5 in which the first threshold voltage is more positive than the second threshold voltage.

11. The circuit of claim 5 in which the amplifier, current mirror, first and second comparators, and flip-flop are fabricated on a single integrated circuit, and the capacitor comprises an external capacitor that is coupled to the first current output of the amplifier through an external integrated circuit bonding pad (36).

12. The circuit of claim 5 in which the flip-flop comprises an R-S flip-flop having reset input forming the first input of the flip-flop and a set input forming the second input of the flip-flop.

13. The circuit of claim 5 in which the enable signal comprises a voltage pulse.

14. The circuit of claim 5 in which the output signal is a voltage pulse that has a pulsewidth equal to $2C(V_H-V_L)/I$, wherein C is the value of the capacitor, $V_H$ is the value of the first threshold voltage, $V_L$ is the value of the second threshold voltage, and I is the total output current of the amplifier.

15. An oscillator circuit (30) comprising:

an amplifier (12) having a voltage input and first and second current outputs;

a current mirror (14) having an input coupled to the second current output of the amplifier and an output coupled to the first current output of the amplifier;

a first comparator (16) having a first input coupled to the first current output of the amplifier, a second input for receiving a first threshold voltage, and an output;

a second comparator (18) having a first input coupled to the first current output of the amplifier, a second input for receiving a second threshold voltage, and an output;

a capacitor (22) coupled between the first current output of the amplifier and ground; and a flip-flop (24) having a first input coupled to the output of the first comparator, a second input coupled to the output of the second comparator, and an output for providing an oscillating output signal.

16. The oscillator circuit of claim 15 in which the amplifier comprises:

a differential pair of transistors (Q1, Q2) having a pair of bases wherein one of the bases forms the voltage input and the other of the bases is coupled to a reference voltage source, a pair of collectors forming the first and second current outputs, and an emitter node; and a current source (34) coupled to the emitter node.

17. The oscillator circuit of claim 15 in which each of the transistors in the differential pair of transistors comprises an NPN bipolar transistor.

18. The oscillator circuit of claim 15 in which the current mirror comprises four transistors configured in a super-Wilson current mirror configuration.

19. The oscillator circuit of claim 18 in which each of the transistors in the super-Wilson current mirror comprises a PNP bipolar transistor.

20. The oscillator circuit of claim 19 in which the first threshold voltage is more positive than the second threshold voltage.

21. The oscillator circuit of claim 15 in which the amplifier, current mirror, first and second comparators, and flip-flop are fabricated on a single integrated circuit, and the capacitor comprises an external capacitor that is coupled to the first current output of the amplifier through an external integrated circuit bonding pad (36).

22. The oscillator circuit of claim 15 in which the flip-flop comprises an R-S flip-flop having reset input forming the first input of the flip-flop and a set input forming the second input of the flip-flop.

23. The circuit of claim 15 in which the oscillating output signal has a period equal to $2C(V_H-V_L)/I$, wherein C is the value of the capacitor, $V_H$ is the value of the first threshold voltage, $V_L$ is the value of the second threshold voltage, and I is the total output current of the amplifier.

* * * * *